(12) United States Patent
Wu et al.

(10) Patent No.: US 9,397,228 B2
(45) Date of Patent: Jul. 19, 2016

(54) SEMICONDUCTOR DEVICE STRUCTURE AND METHOD FOR FORMING THE SAME

(71) Applicant: Taiwan Semiconductor Manufacturing Co., Ltd, Hsin-Chu (TW)

(72) Inventors: Chang-Ming Wu, New Taipei (TW); Wei-Hang Huang, Kaohsiung (TW); Shih-Chang Liu, Alian Township (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/560,353

(22) Filed: Dec. 4, 2014

(65) Prior Publication Data

US 2016/0163876 A1     Jun. 9, 2016

(51) Int. Cl.
*H01L 21/3205* (2006.01)
*H01L 29/788* (2006.01)
*H01L 29/66* (2006.01)

(52) U.S. Cl.
CPC ...... *H01L 29/7887* (2013.01); *H01L 29/66825* (2013.01)

(58) Field of Classification Search
CPC .................................................. H01L 21/3205
USPC .......................................................... 257/264
See application file for complete search history.

(56) References Cited

U.S. PATENT DOCUMENTS

| | | | |
|---|---|---|---|
| 7,002,200 B2 | 2/2006 | Hsieh | |
| 8,445,953 B2 | 5/2013 | Shen et al. | |
| 2009/0098721 A1* | 4/2009 | Liu et al. | 438/593 |
| 2009/0200597 A1* | 8/2009 | Sakai | 257/320 |

* cited by examiner

*Primary Examiner* — Marc Armand
(74) *Attorney, Agent, or Firm* — Birch, Stewart, Kolasch & Birch, LLP

(57) ABSTRACT

A semiconductor device structure is provided. The semiconductor device structure includes a semiconductor substrate. The semiconductor device structure includes a first gate stack over the semiconductor substrate. The semiconductor device structure includes a second gate stack over the semiconductor substrate. The semiconductor device structure includes an erase gate between the first gate stack and the second gate stack. The erase gate has a recess recessed toward the semiconductor substrate. The semiconductor device structure includes a first word line adjacent to the first gate stack. The semiconductor device structure includes a second word line adjacent to the second gate stack.

20 Claims, 18 Drawing Sheets

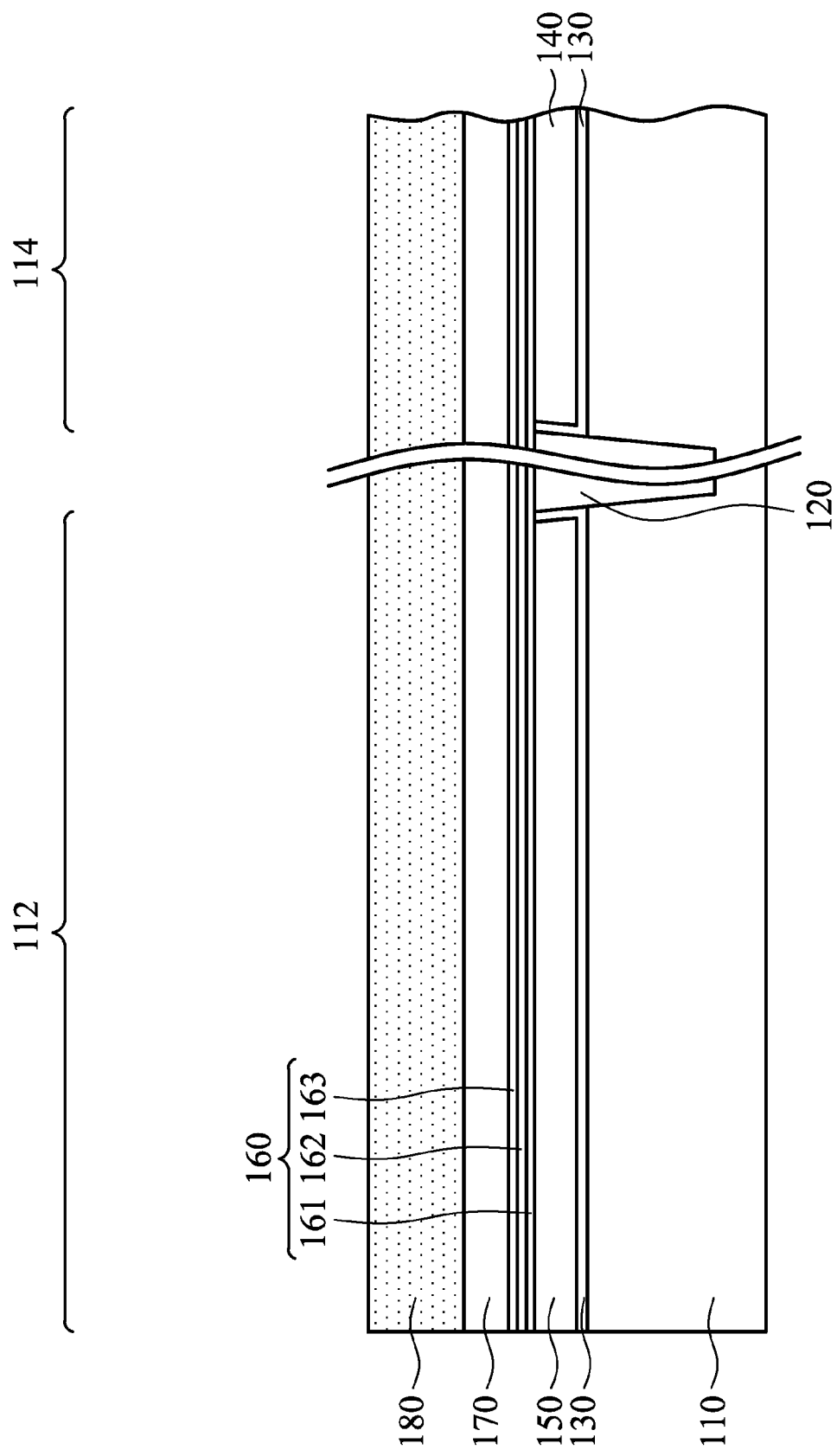

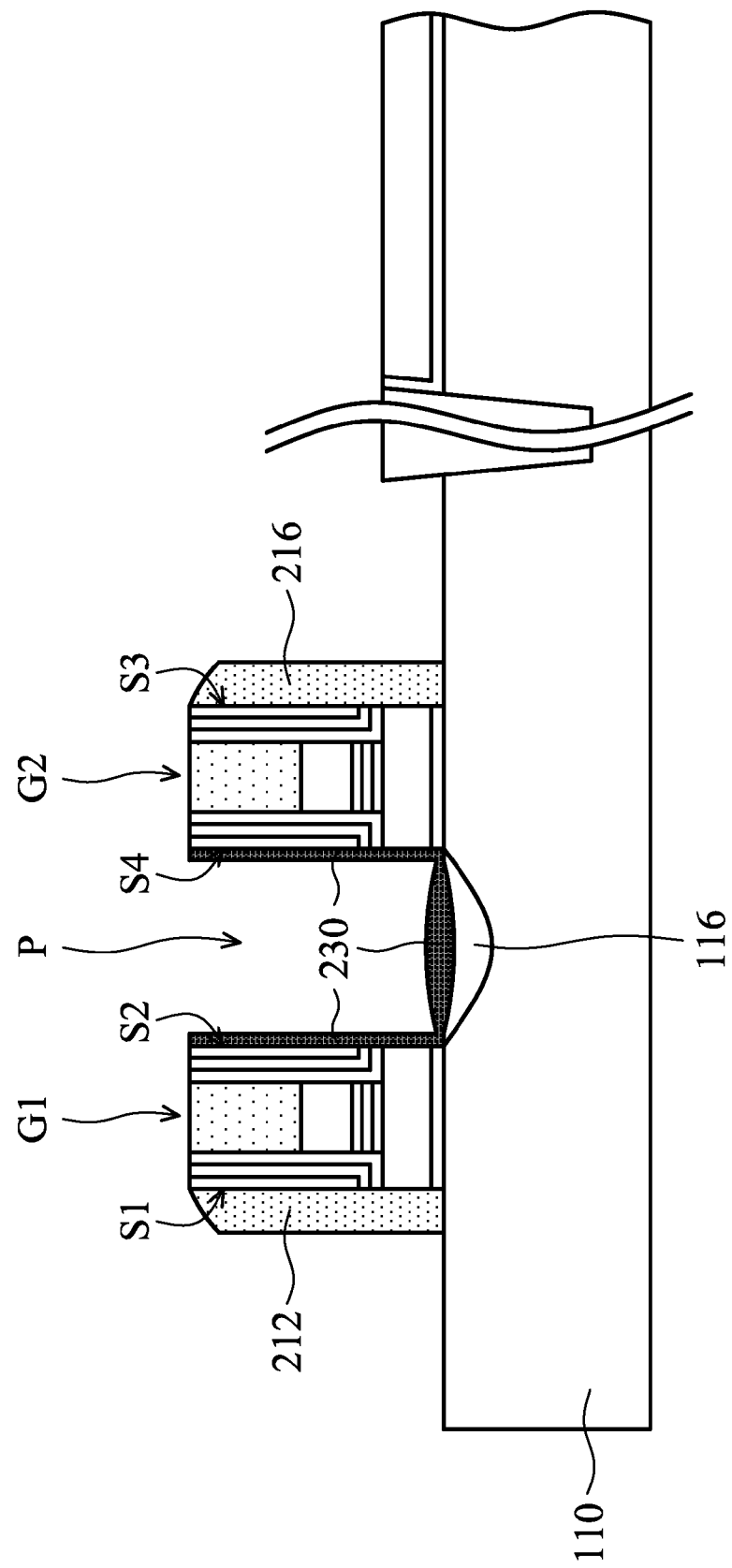

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1B:
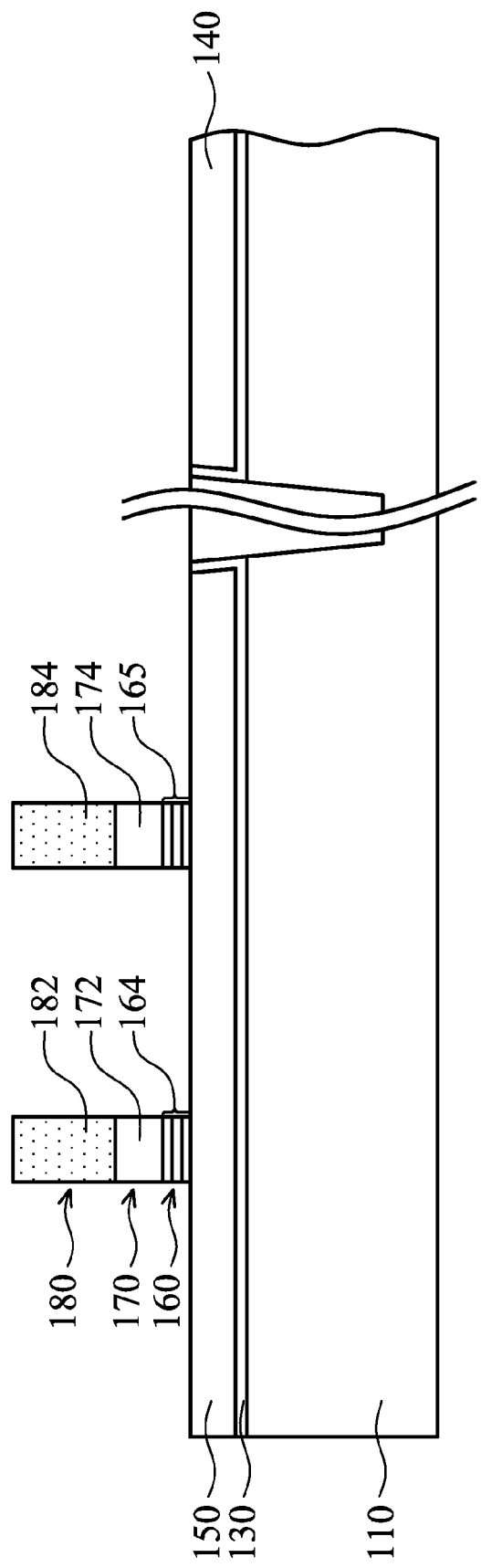
FIGS. 1A-1R are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1C:
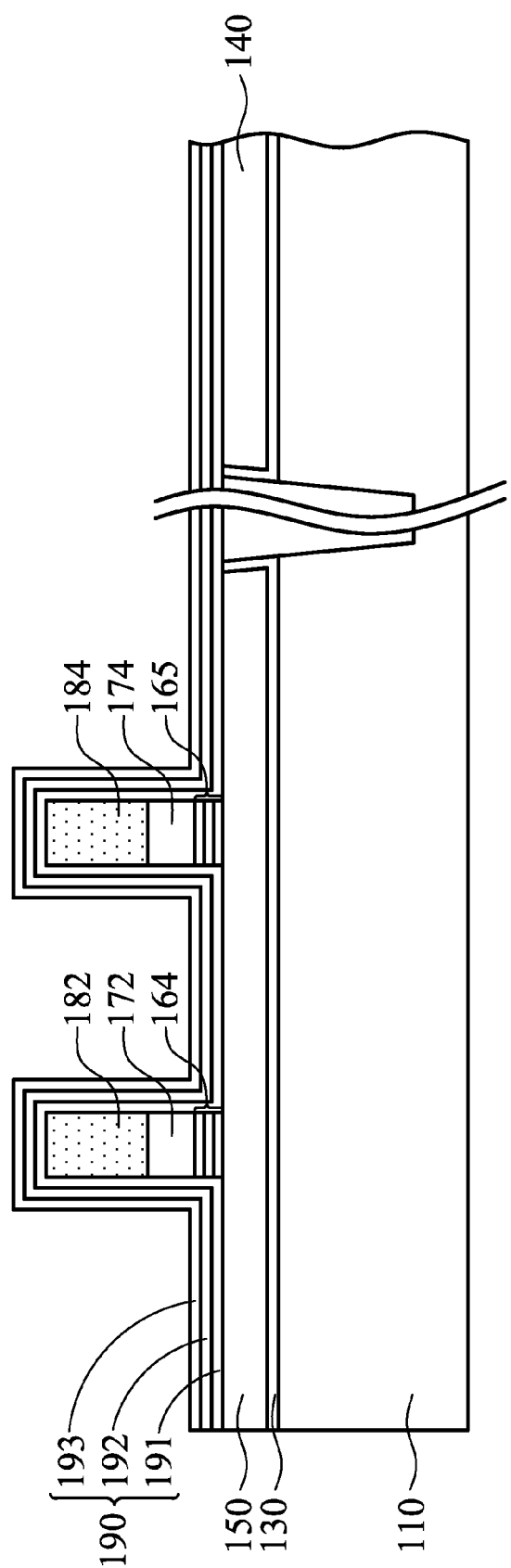
Figure 1D:
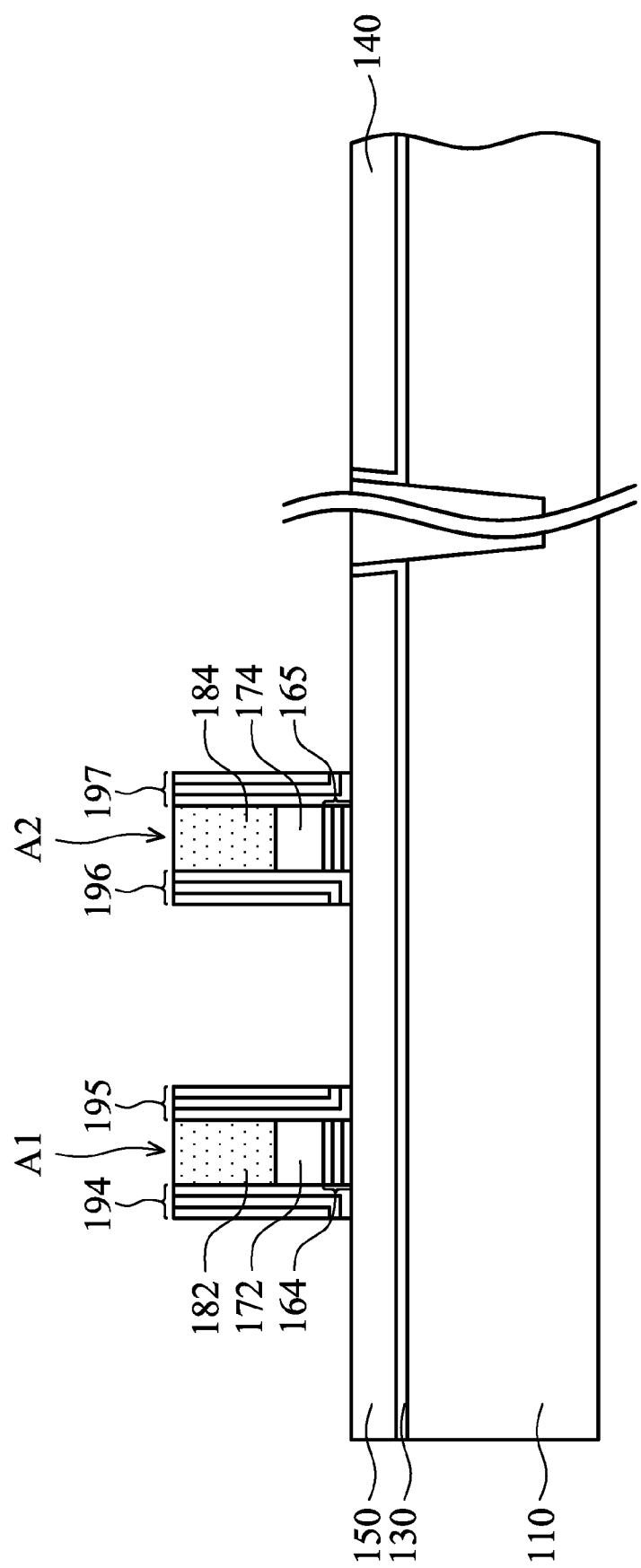
Figure 1E:
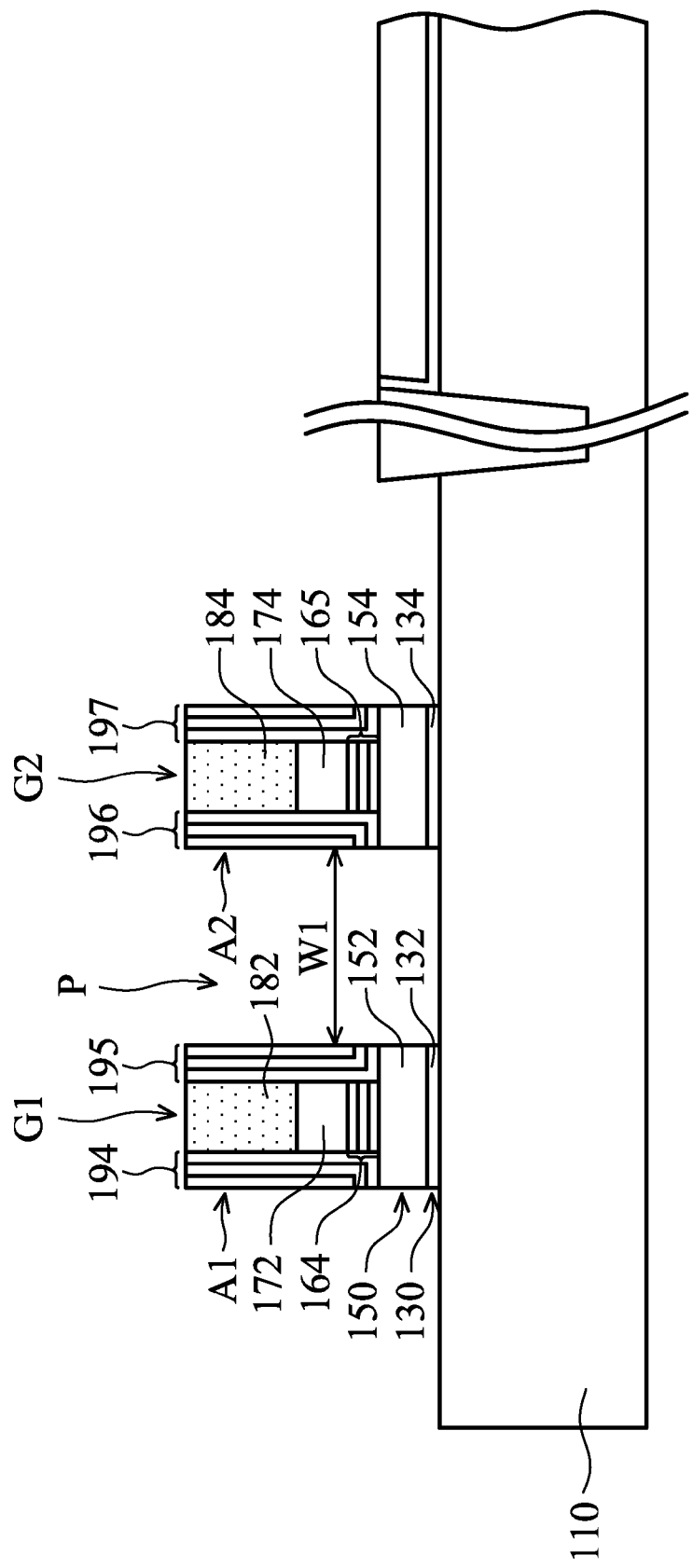
Figure 1F:
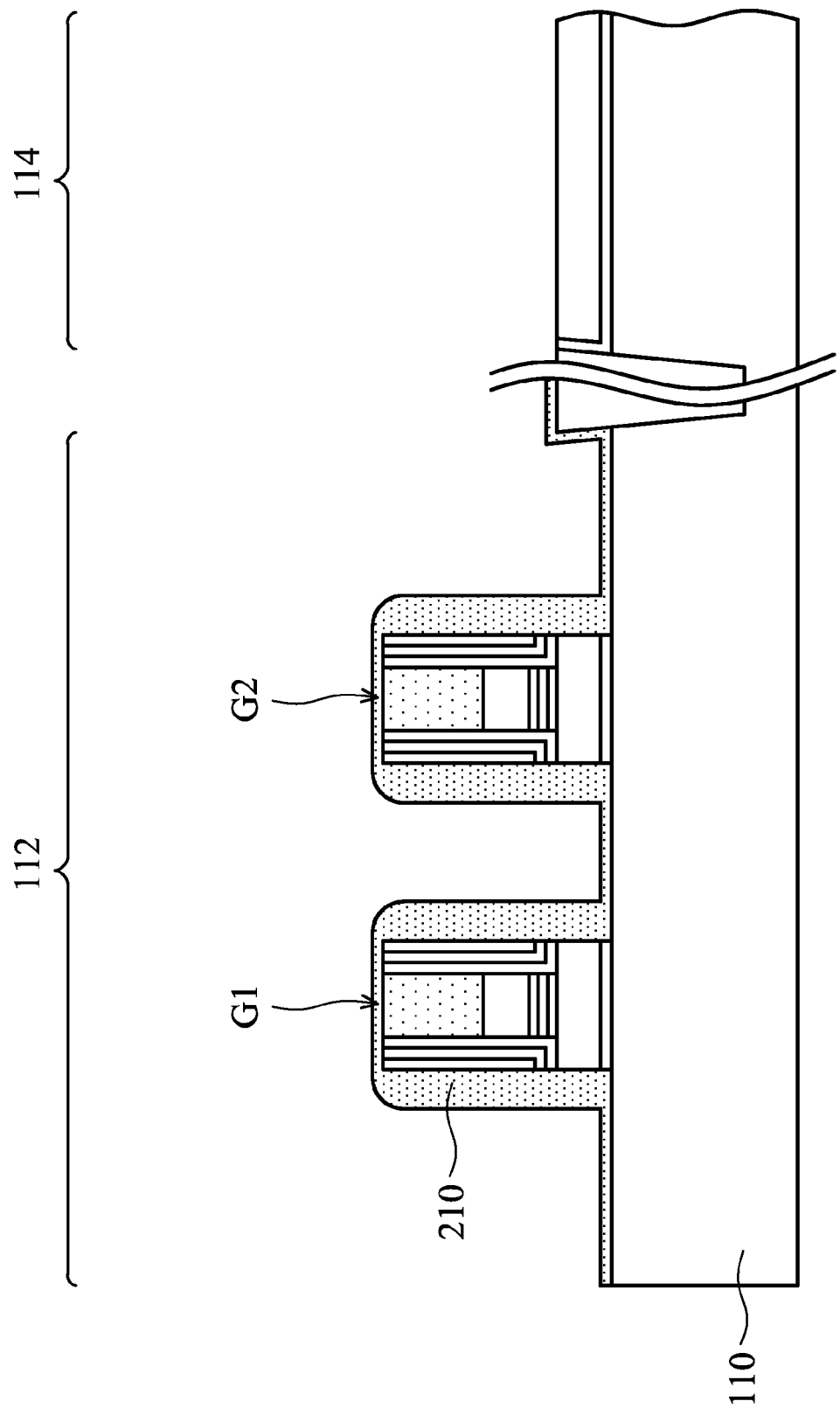
Figure 1G:
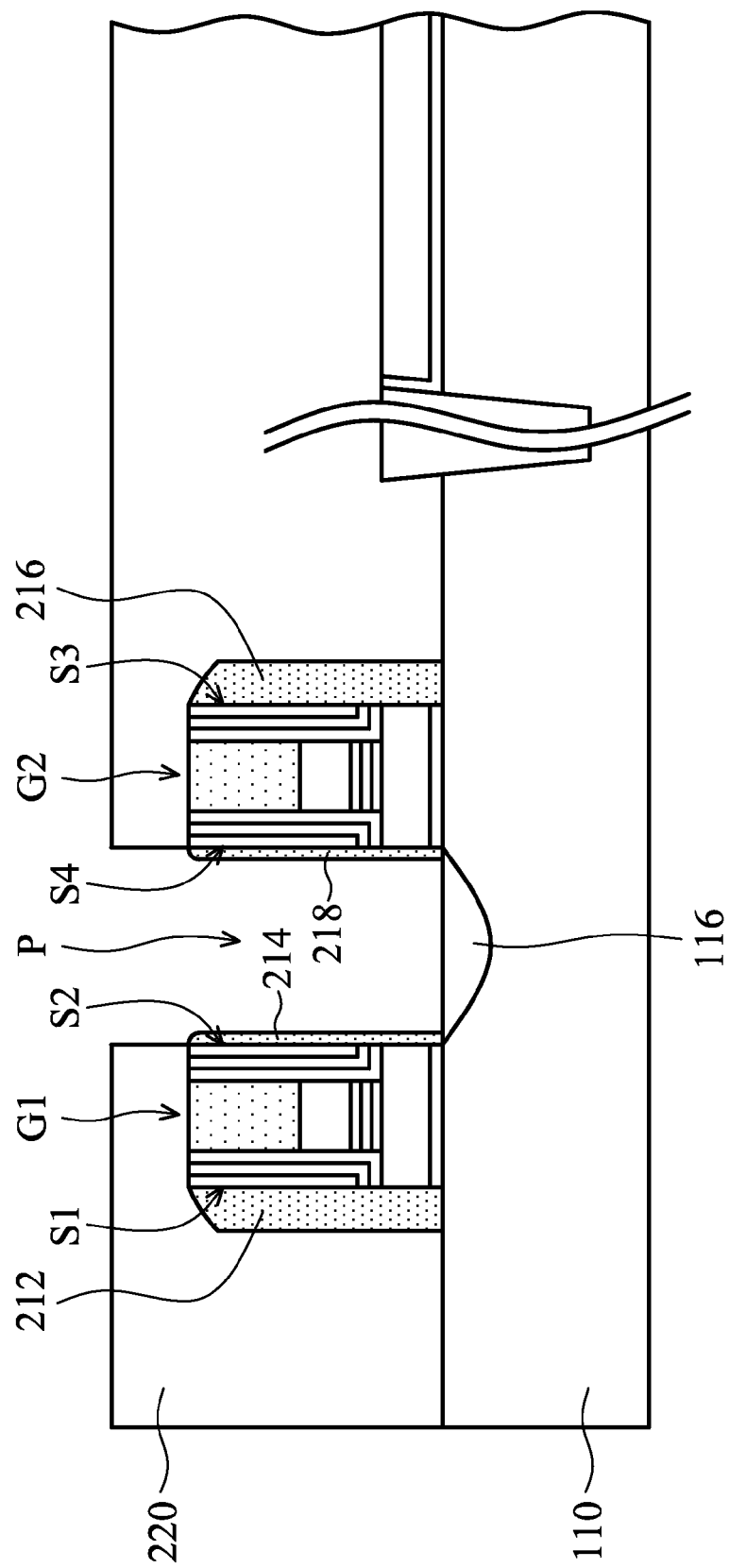
Figure 1I:
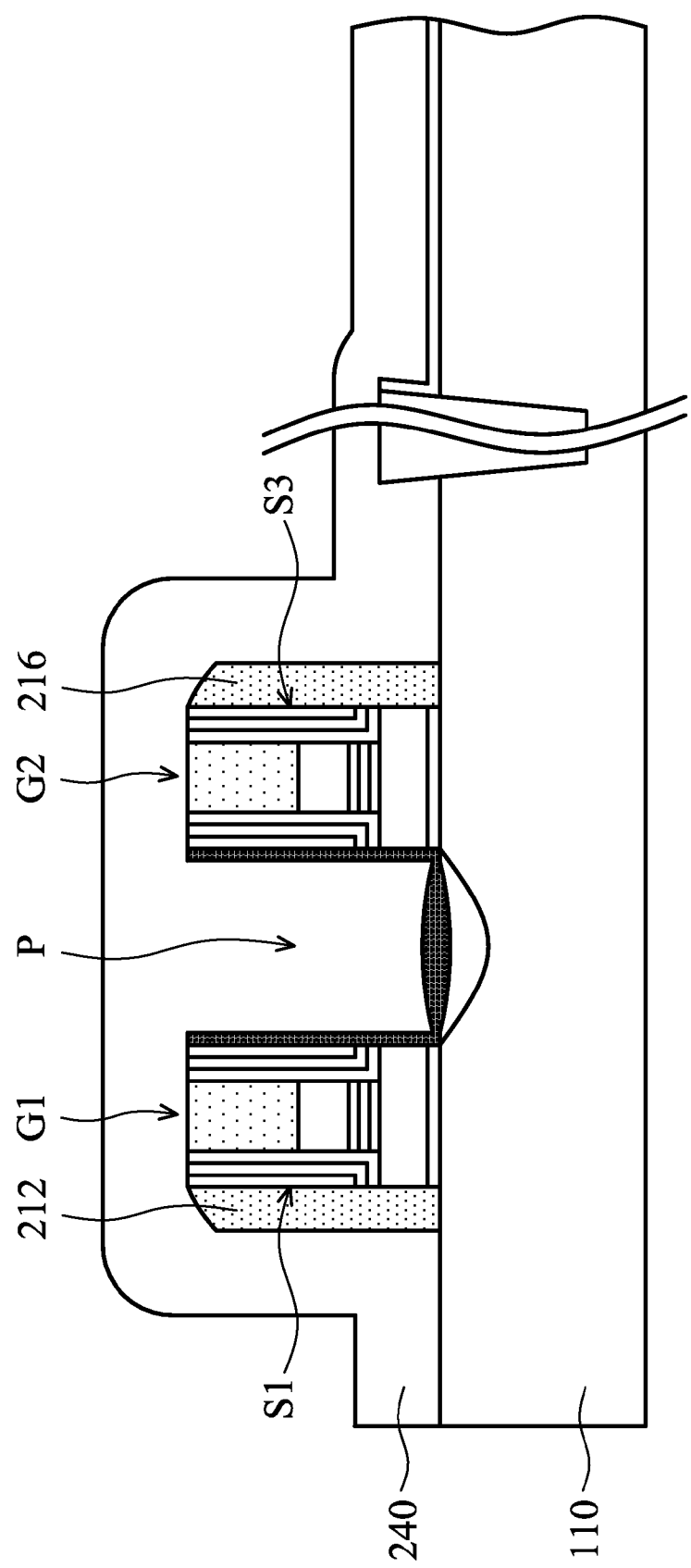
Figure 1J:
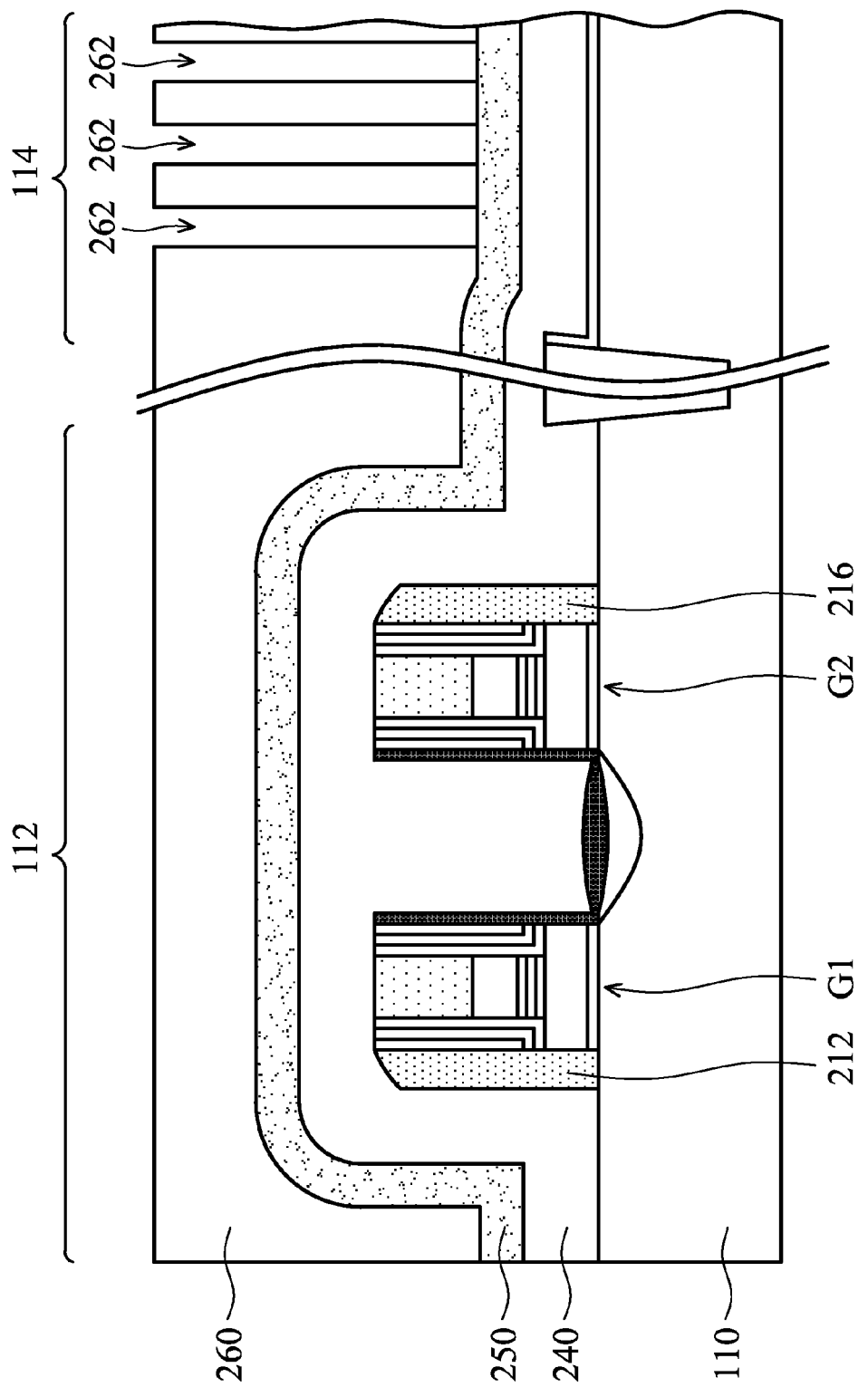
Figure 1K:
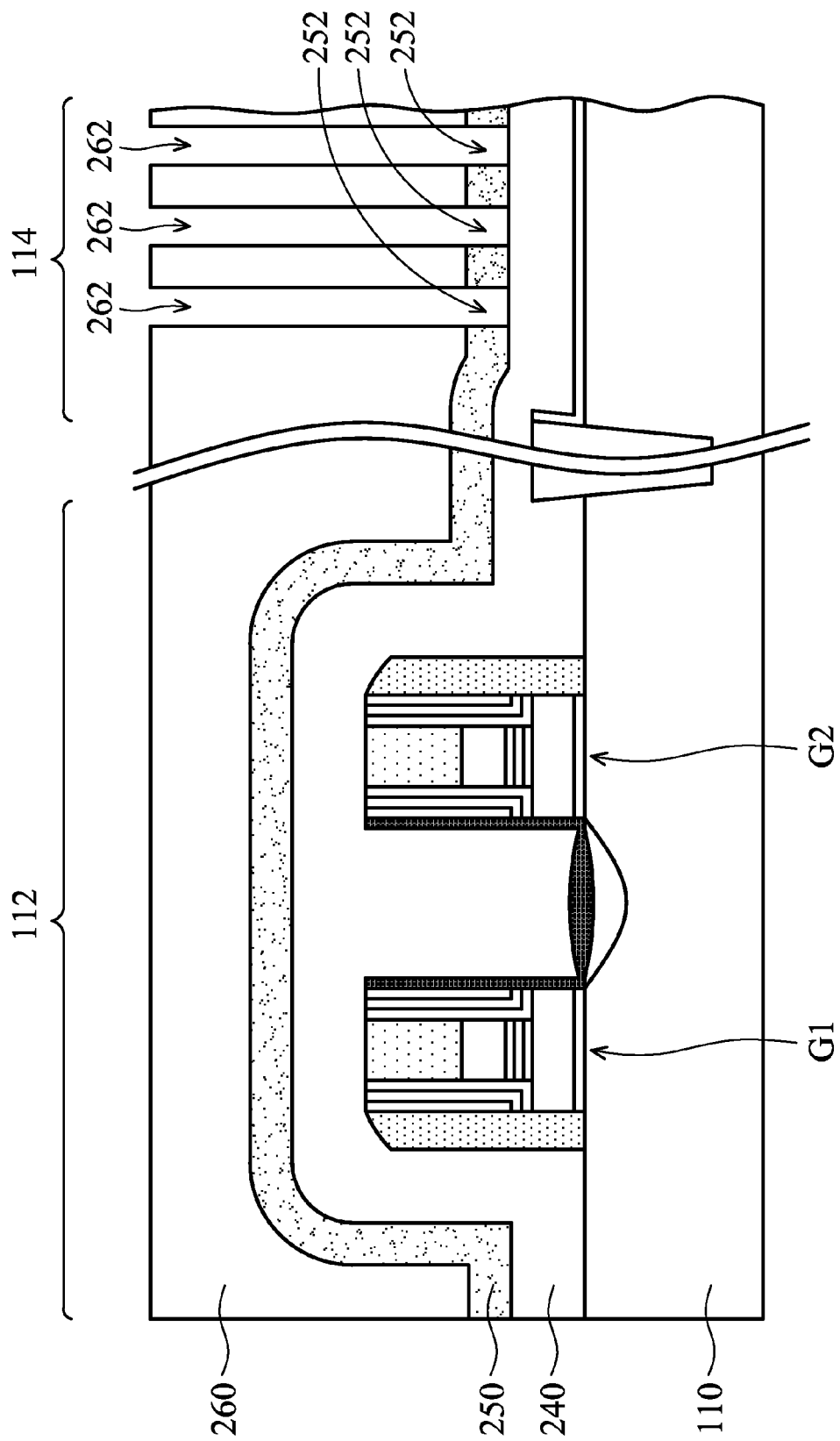
Figure 1L:
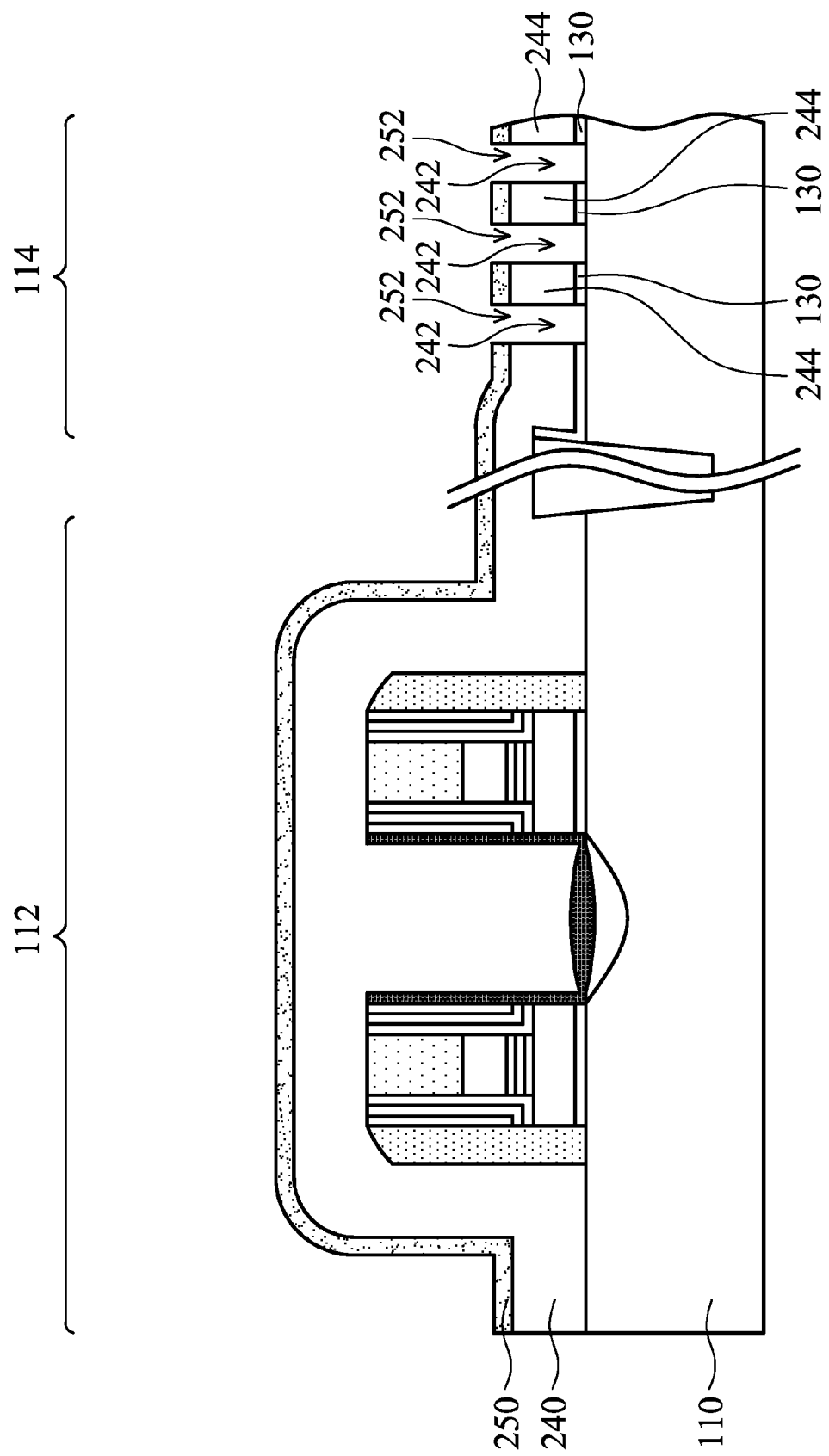
Figure 1M:
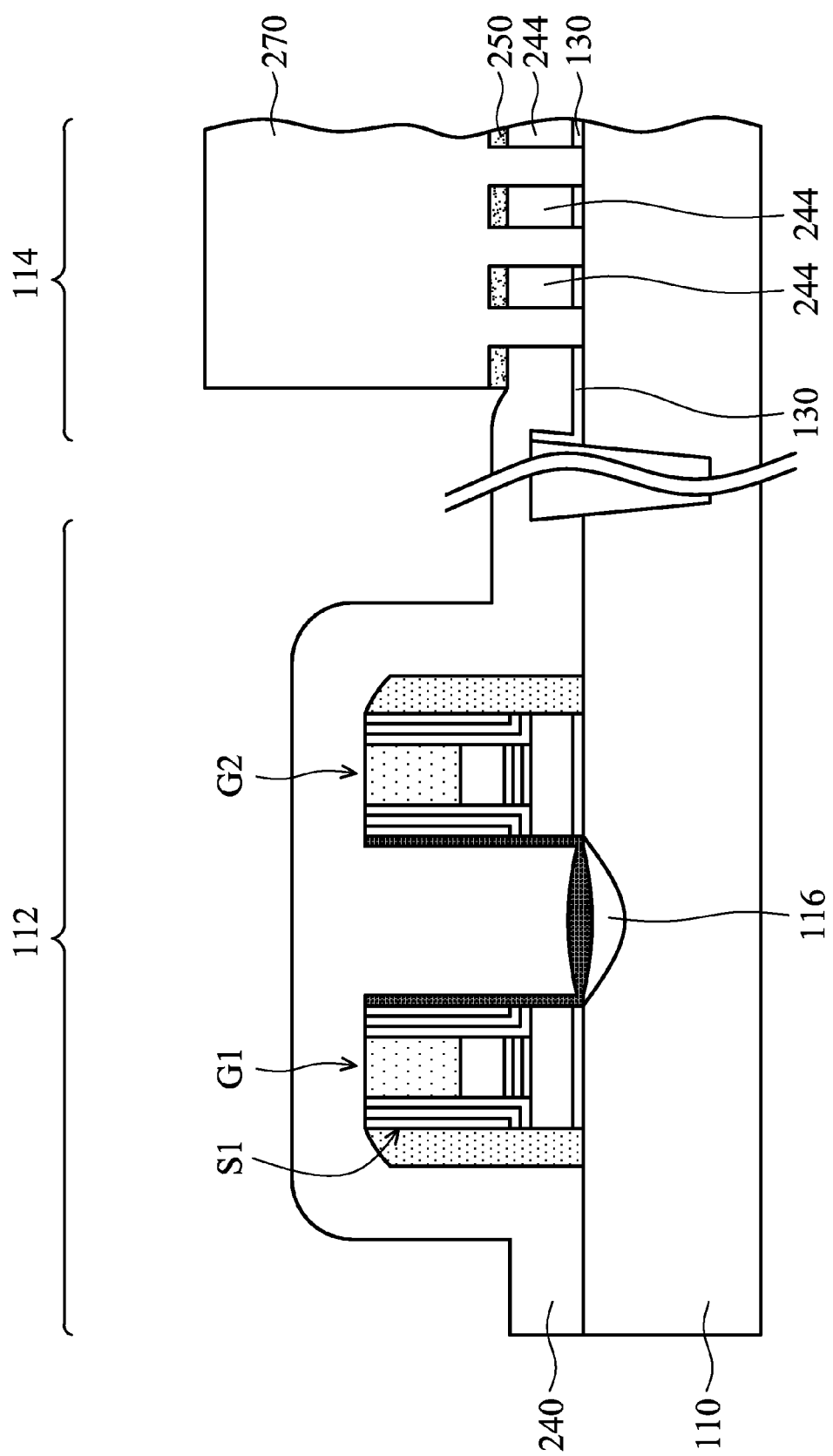
Figure 1N:
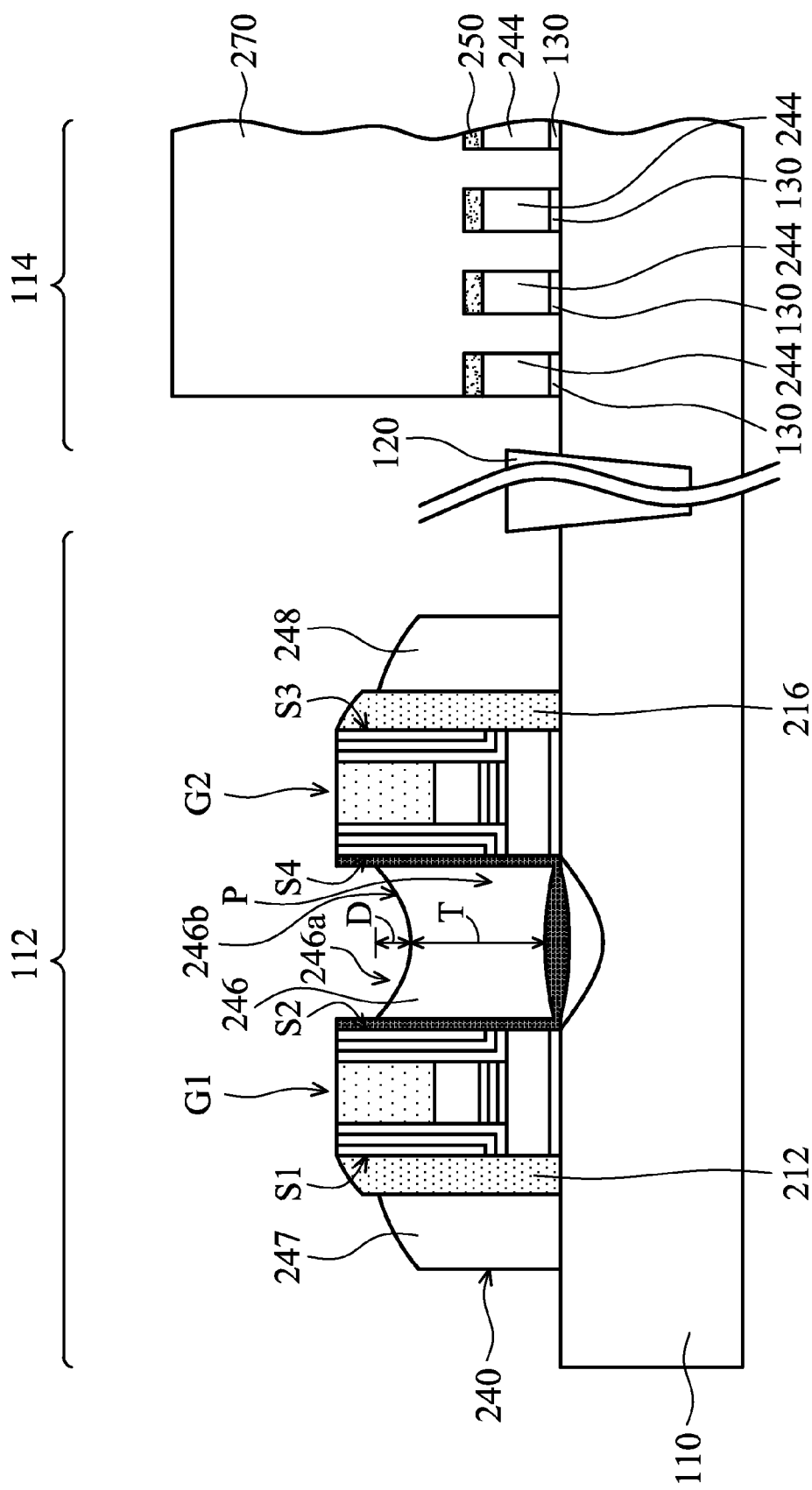
Figure 1O:
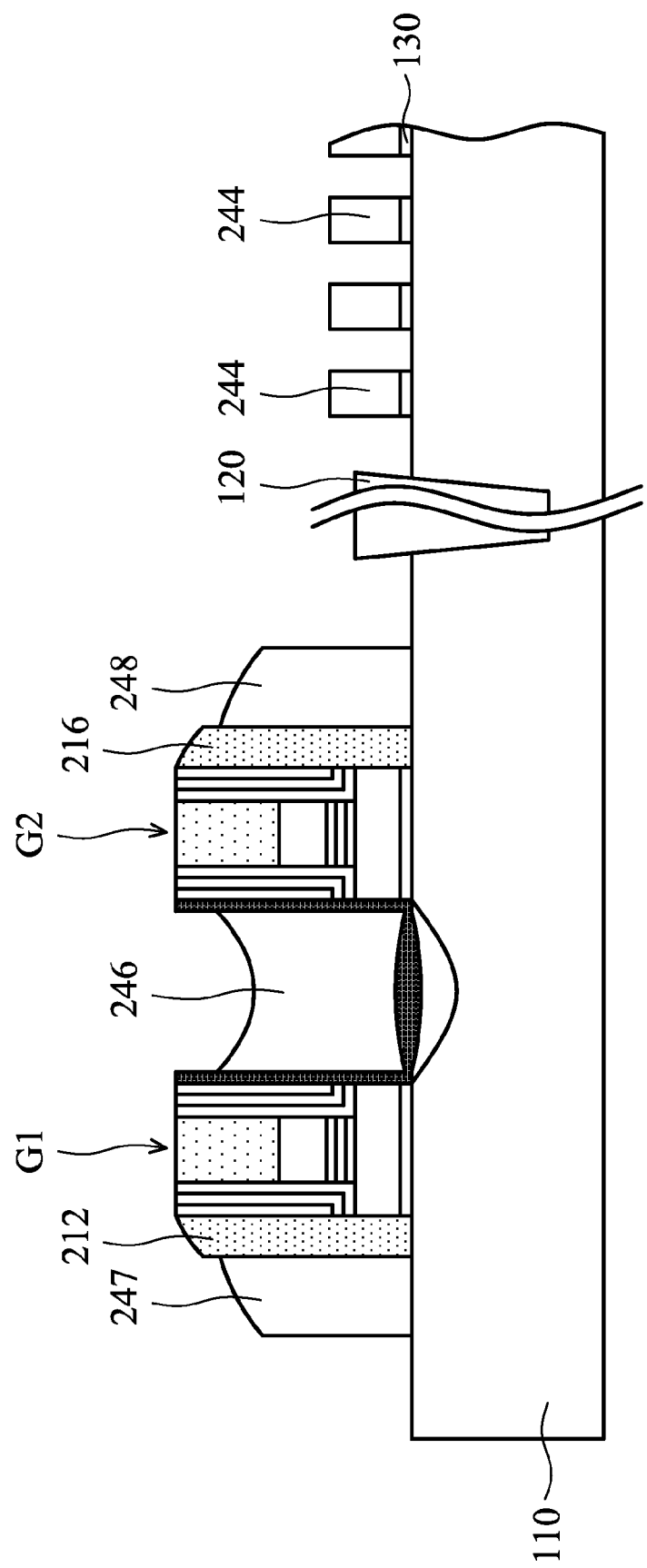
Figure 1P:
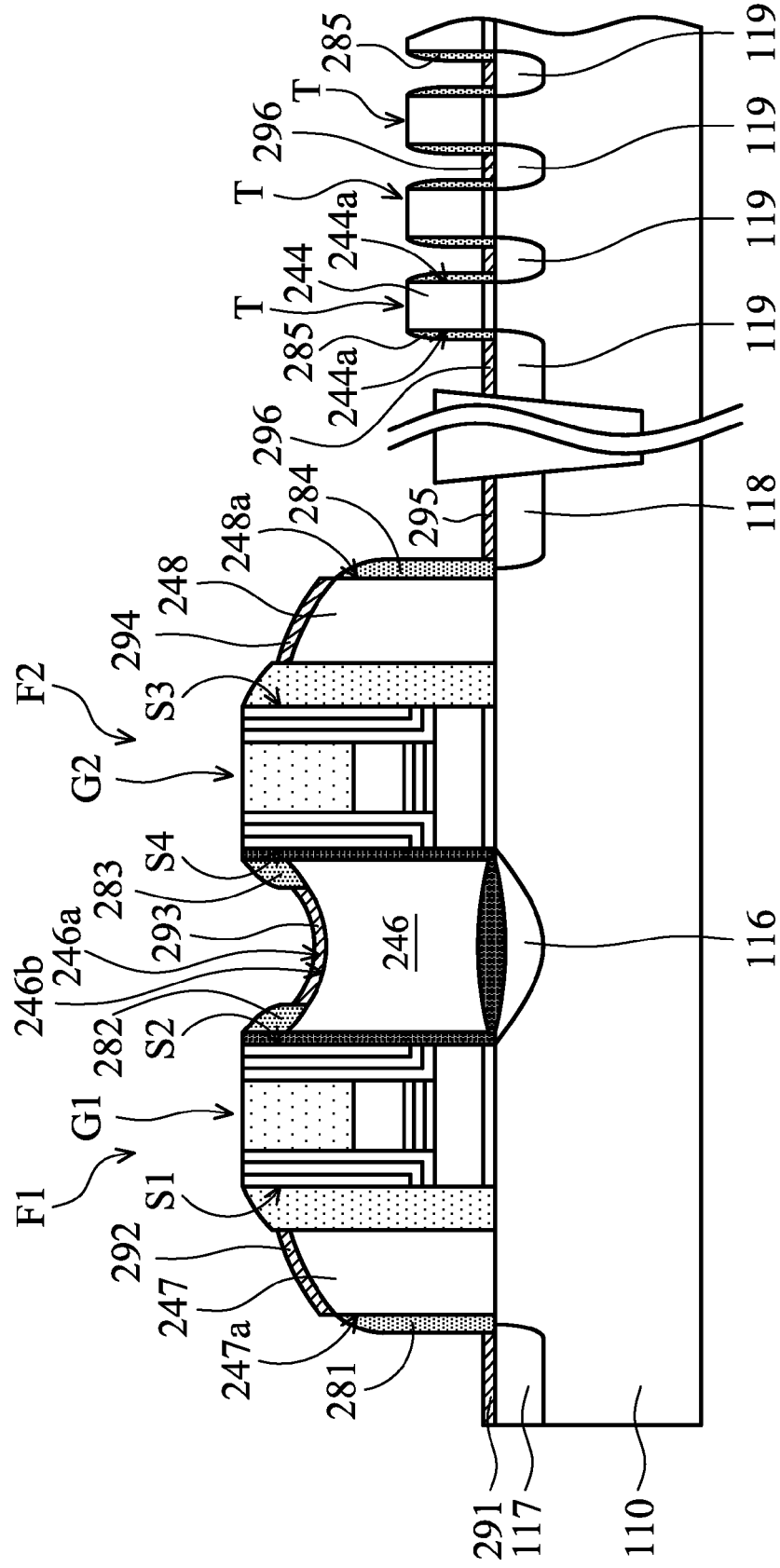
Figure 1Q:
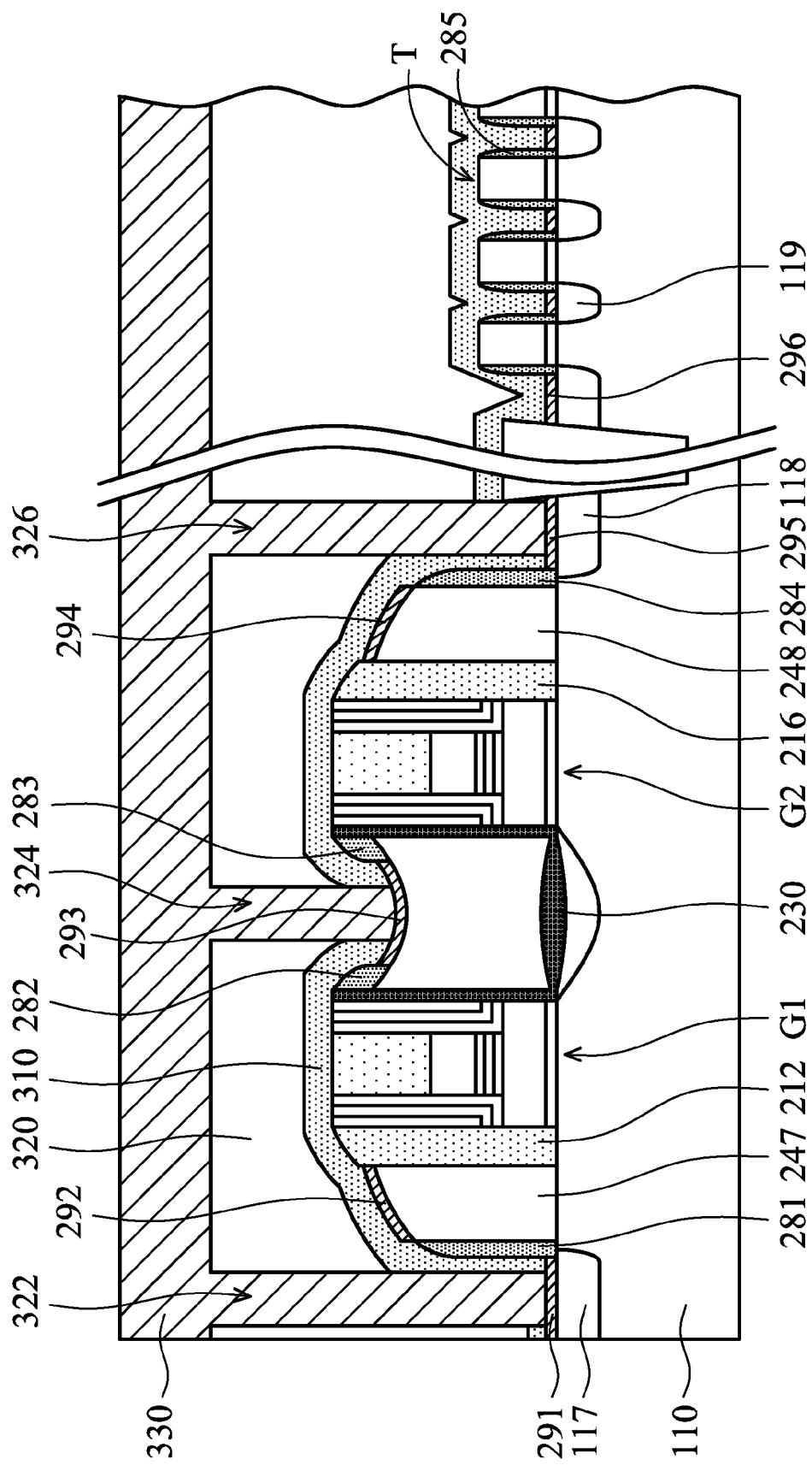
Figure 1R:
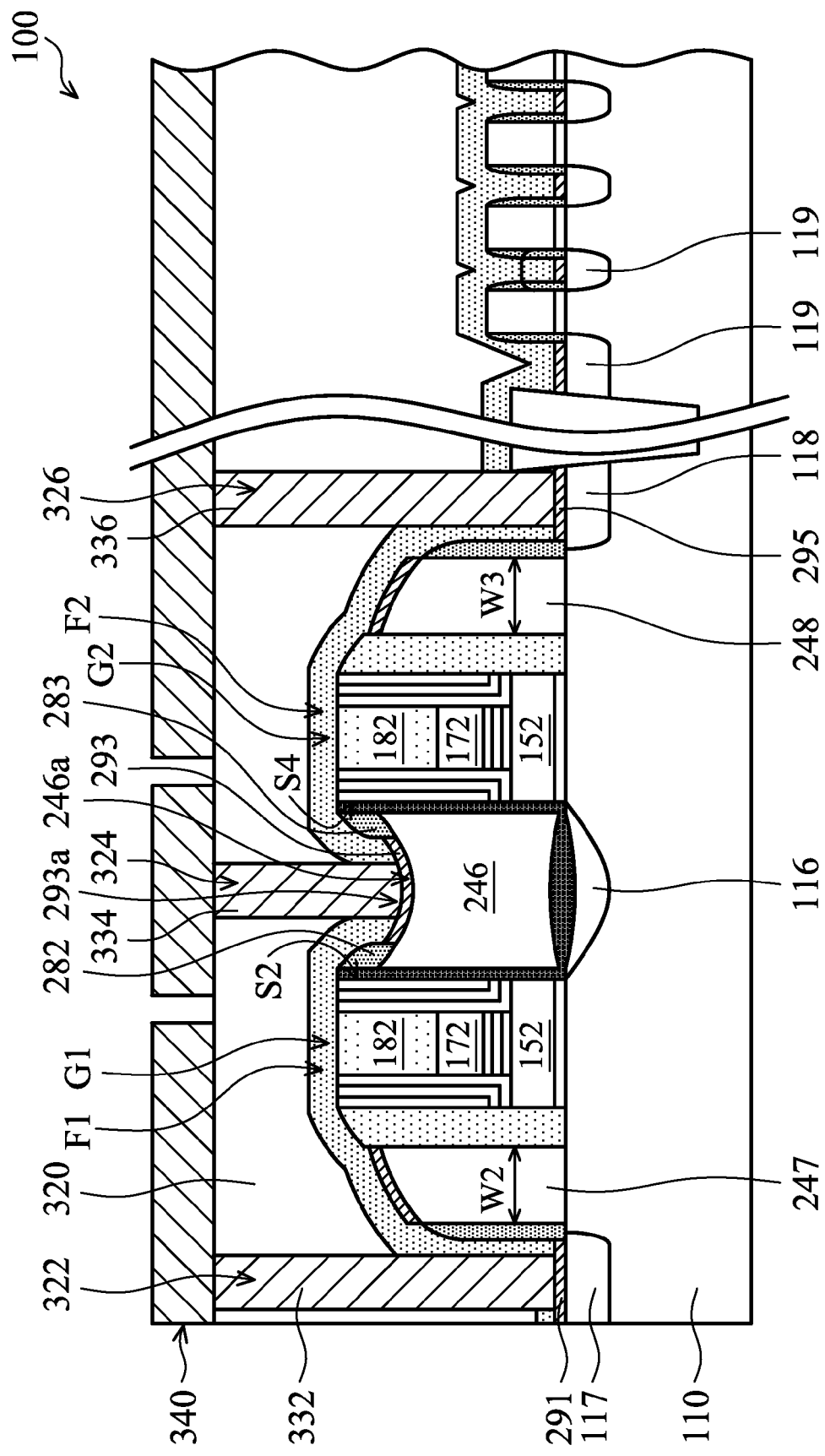

FIGS. 1A-1R are cross-sectional views of various stages of a process for forming a semiconductor device structure 100, in accordance with some embodiments. As shown in FIG. 1A, a semiconductor substrate 110 is provided. The semiconductor substrate 110 includes a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

As shown in FIG. 1A, a shallow trench isolation (STI) structure 120 is formed in the semiconductor substrate 110, in accordance with some embodiments. The STI structure 120 is configured to define and electrically isolate various device elements (not shown) formed in the semiconductor substrate 110, in accordance with some embodiments.

Examples of the various device elements include memory cells, transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

The STI structure 120 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The STI structure 120 is formed by using an isolation technology, such as local oxidation of semiconductor (LOCOS), shallow trench isolation (STI), or the like, in accordance with some embodiments.

In some embodiments, the formation of the STI structure 120 includes patterning the semiconductor substrate 110 by performing a photolithography process and an etching process on the semiconductor substrate 110 so as to form a trench in the semiconductor substrate 110; and filling the trench with the dielectric material.

The etching process for forming the trench includes a dry etching process, a wet etching process, a plasma etching process, or a combination thereof, in accordance with some embodiments. The filling of the trench includes a chemical vapor deposition process, in accordance with some embodiments. In some embodiments, the filled trench has a multi-layer structure, such as a thermal oxide liner layer filled with silicon nitride or silicon oxide.

In some embodiments, the semiconductor substrate 110 has a cell region 112 and a logic region 114 separated from each other by the STI structure 120. The cell region 112 is also referred to as a memory cell region, in accordance with some embodiments.

As shown in FIG. 1A, a gate dielectric material layer 130 is deposited over the semiconductor substrate 110, in accordance with some embodiments. The gate dielectric material layer 130 is made of silicon oxide, in accordance with some embodiments. The gate dielectric material layer 130 is deposited using a chemical vapor deposition process (CVD process), in accordance with some embodiments.

As shown in FIG. 1A, a mask layer 140 is formed over the gate dielectric material layer 130 in the logic region 114, in accordance with some embodiments. The mask layer 140 is configured to protect the semiconductor substrate 110 in the logic region 114 from damage during the subsequent processes, in accordance with some embodiments.

In some embodiments, the mask layer 140 includes nitride, such as silicon nitride, silicon oxynitride, or the like. The mask layer 140 is formed by a depositing process (such as a chemical vapor deposition process), a photolithography process, and an etching process, in accordance with some embodiments.

As shown in FIG. 1A, a gate material layer 150 is deposited over the gate dielectric material layer 130 in the cell region 112, in accordance with some embodiments. In some embodiments, the gate material layer 150 is also referred to as a floating gate material layer. The gate material layer 150 is made of polysilicon, in accordance with some embodiments.

The gate material layer 150 is deposited using a chemical vapor deposition process, in accordance with some embodiments. After the deposition of the gate material layer 150, a planarization process is performed to remove the gate material layer 150 over the STI structure 120, in accordance with some embodiments.

As shown in FIG. 1A, a dielectric structure 160 is formed over the gate material layer 150 and the mask layer 140, in accordance with some embodiments. The dielectric structure 160 includes a silicon dioxide layer 161, a silicon nitride layer 162, and a silicon dioxide layer 163, in accordance with some embodiments. The silicon nitride layer 162 is positioned between the silicon dioxide layers 161 and 163, in accordance with some embodiments.

The dielectric structure 160 is also referred to as an ONO (oxide/nitride/oxide) layer, in accordance with some embodiments. In some other embodiments, the dielectric structure 160 includes other suitable materials. The silicon dioxide layer 161, the silicon nitride layer 162, and the silicon dioxide layer 163 are formed using chemical vapor deposition processes, in accordance with some embodiments.

As shown in FIG. 1A, a gate material layer 170 is deposited over the dielectric structure 160, in accordance with some embodiments. In some embodiments, the gate material layer 170 is also referred to as a control-gate material layer. The gate material layer 170 is made of polysilicon, in accordance with some embodiments. The gate material layer 170 is deposited using a chemical vapor deposition process, in accordance with some embodiments.

As shown in FIG. 1A, a mask layer 180 is formed over the gate material layer 170, in accordance with some embodiments. The mask layer 180 is configured to protect the gate material layer 170 from damage during the subsequent processes, in accordance with some embodiments.

In some embodiments, the mask layer 180 includes nitride, such as silicon nitride, silicon oxynitride, or the like. The mask layer 180 is formed by a depositing process (such as a chemical vapor deposition process), in accordance with some embodiments.

Thereafter, as shown in FIG. 1B, a portion of the mask layer 180 is removed, in accordance with some embodiments. The removal process includes a photolithography process and an etching process, in accordance with some embodiments. The etching process includes a dry etching process, in accordance with some embodiments. After the removal process, the remaining mask layer 180 includes mask structures 182 and 184 separated from each other, in accordance with some embodiments.

Thereafter, an etching process is performed on the gate material layer 170 and the dielectric structure 160 using the mask structures 182 and 184 as an etching mask, in accordance with some embodiments. The etching process includes a dry etching process, in accordance with some embodiments.

After the etching process, the remaining gate material layer 170 includes control gates 172 and 174 separated from each other, in accordance with some embodiments. The remaining dielectric structure 160 includes dielectric layers 164 and 165 separated from each other, in accordance with some embodiments.

As shown in FIG. 1C, a dielectric structure 190 is deposited over the gate material layer 150 and the mask layer 140 to cover the dielectric layers 164 and 165, the control gates 172 and 174, and the mask structures 182 and 184, in accordance with some embodiments. The dielectric structure 190 includes a silicon dioxide layer 191, a silicon nitride layer 192, and a silicon dioxide layer 193, in accordance with some embodiments.

The silicon nitride layer 192 is positioned between the silicon dioxide layers 191 and 193, in accordance with some embodiments. The dielectric structure 190 is also referred to as an ONO (oxide/nitride/oxide) layer, in accordance with some embodiments. In some other embodiments, the dielectric structure 190 includes other suitable materials. The silicon dioxide layer 191, the silicon nitride layer 192, and the silicon dioxide layer 193 are formed using chemical vapor deposition processes, in accordance with some embodiments.

As shown in FIG. 1D, a portion of the dielectric structure 190 is removed, in accordance with some embodiments. The portion of the dielectric structure 190 is removed using an anisotropic etching process, in accordance with some embodiments. The anisotropic etching process includes a dry etching process, in accordance with some embodiments. The remaining dielectric structure 190 includes spacers 194, 195, 196, and 197 spaced apart from each other, in accordance with some embodiments.

The spacers 194 and 195 are located over two opposite sidewalls of the stack A1, which includes the dielectric layer 164, the control gate 172, and the mask structure 182, in accordance with some embodiments. The spacers 196 and 197 are located over two opposite sidewalls of the stack A2, which includes the dielectric layer 165, the control gate 174, and the mask structure 184, in accordance with some embodiments.

As shown in FIG. 1E, portions of the gate material layer 150 and the gate dielectric material layer 130 are removed, in accordance with some embodiments. The removal process includes a dry etching process using the stacks A1 and A2 as an etching mask, in accordance with some embodiments. After the removal process, the remaining gate material layer 150 includes floating gates 152 and 154 separated from each other, in accordance with some embodiments.

The control gate 172 is located over the floating gate 152, in accordance with some embodiments. The control gate 174 is located over the floating gate 154, in accordance with some embodiments. The remaining gate dielectric material layer 130 includes gate dielectric layers 132 and 134 separated from each other, in accordance with some embodiments.

In some embodiments, a gate stack G1 including the floating gate 152, the dielectric layer 164, and the control gate 172 is formed. In some embodiments, the gate stack G1 further includes the gate dielectric layer 132, the mask structure 182, and the spacers 194 and 195. In some embodiments, a gate stack G2 including the floating gate 154, the dielectric layer 165, and the control gate 174 is formed.

In some embodiments, the gate stack G2 further includes the gate dielectric layer 134, the mask structure 184, and the spacers 196 and 197. The gate stacks G1 and G2 are separated from each other by a gap P, in accordance with some embodiments. The gap P has a width W1 ranging from about 500 Å to about 1200 Å, in accordance with some embodiments.

As shown in FIG. 1F, a spacer material layer 210 is formed over the semiconductor substrate 110 in the cell region 112, in accordance with some embodiments. The spacer material layer 210 includes oxide, such as silicon oxide, in accordance with some embodiments.

The spacer material layer 210 is formed using a high temperature oxidation (HTO) process, in accordance with some embodiments. Thereafter, the spacer material layer 210 over the gate stacks G1 and G2 and the semiconductor substrate 110 is thinned, in accordance with some embodiments. The thinning process includes a dry etching process, in accordance with some embodiments.

As shown in FIG. 1G, the spacer material layer 210 over the gate stacks G1 and G2 and the semiconductor substrate 110 is removed, in accordance with some embodiments. The removal process includes, for example, a wet etching process. After the removal process, the remaining spacer material layer 210 includes spacers 212, 214, 216, and 218, in accordance with some embodiments.

The gate stack G1 has two opposite sidewalls S1 and S2, in accordance with some embodiments. The spacers 212 and 214 are located over the sidewalls S1 and S2, respectively, in accordance with some embodiments. The gate stack G2 has two opposite sidewalls S3 and S4, in accordance with some embodiments. The spacers 216 and 218 are located over the sidewalls S3 and S4, respectively, in accordance with some embodiments. In some embodiments, the sidewalls S1 and S3 face away from the gap P, and the sidewalls S2 and S4 face the gap P.

As shown in FIG. 1G, a mask layer 220 is formed over the semiconductor substrate 110 to cover the gate stacks G1 and G2 and the spacers 212 and 216, in accordance with some embodiments. The mask layer 220 exposes the spacers 214 and 218, in accordance with some embodiments. The mask layer 220 includes, for example, a photoresist layer.

Thereafter, the spacers 214 and 218 are thinned, in accordance with some embodiments. The thinning process includes an etching process, in accordance with some embodiments. After the thinning process, the thinned spacers 214 and 218 are configured to protect the sidewall S2 of the gate stack G1 and the sidewall S4 of the gate stack G2 from damage during subsequent processes, in accordance with some embodiments.

As shown in FIG. 1G, a doped region 116 is formed in the semiconductor substrate 110 exposed by the gap P, in accordance with some embodiments. The doped region 116 is doped with n-type impurities (e.g., phosphorus) or p-type impurities (e.g., boron), in accordance with some embodiments. The doped region 116 is formed using, for example, an ion implantation process. The doped region 116 is also referred to as a common source region, in accordance with some embodiments.

As shown in FIG. 1H, the spacers 214 and 218 are removed, in accordance with some embodiments. The removal process includes a wet etching process, in accordance with some embodiments. Thereafter, the mask layer 220 is removed, in accordance with some embodiments.

As shown in FIG. 1H, an insulating layer 230 is formed over the sidewalls S2 and S4 and the doped region 116, in accordance with some embodiments. The insulating layer 230 is configured to electrically insulate the gate stacks G1 and G2 and the doped region 116 from elements formed in the gap P subsequently, in accordance with some embodiments.

The insulating layer 230 includes oxide (e.g., silicon oxide), in accordance with some embodiments. The insulating layer 230 is formed using oxide deposition processes, a photolithography process, and an etching process, in accordance with some embodiments. The oxide deposition processes includes an in-situ steam generation (ISSG) process, a high temperature oxide (HTO) process, and a wet oxidation process, in accordance with some embodiments.

As shown in FIG. 1I, a conductive layer 240 is formed over the semiconductor substrate 110 to fill the gap P and cover the gate stacks G1 and G2, in accordance with some embodiments. The conductive layer 240 conformally covers the sidewalls S1 and S3, and the semiconductor substrate 110, in accordance with some embodiments. The conductive layer 240 includes polysilicon or another suitable conductive material. The conductive layer 240 is formed using a chemical vapor deposition process or another suitable deposition process.

As shown in FIG. 1J, a mask layer 250 is deposited over the conductive layer 240, in accordance with some embodiments. The mask layer 250 includes oxide (e.g., silicon oxide), in accordance with some embodiments. The mask layer 250 is deposited using a chemical vapor deposition process or another suitable deposition process.

As shown in FIG. 1J, a mask layer 260 is formed over the mask layer 250, in accordance with some embodiments. The mask layer 260 has trenches 262 exposing the mask layer 250 in the logic region 114, in accordance with some embodiments. The mask layer 260 includes a photoresist layer, in accordance with some embodiments.

As shown in FIG. 1K, a portion of the mask layer 250 is removed through the trenches 262 to form trenches 252 in the mask layer 250 and under the trenches 262, in accordance with some embodiments. The trenches 252 expose the conductive layer 240 in the logic region 114, in accordance with some embodiments. The removal process includes a dry etching process using the mask layer 260 as a mask, in accordance with some embodiments.

As shown in FIG. 1L, the mask layer 260 is removed, in accordance with some embodiments. Thereafter, an etching process is performed to thin the mask layer 250 and remove portions of the conductive layer 240 and the gate dielectric material layer 130 through the trenches 252, in accordance with some embodiments. After the etching process, trenches 242 are formed in the conductive layer 240, in accordance with some embodiments. The conductive layer 240 includes gates 244 between the trenches 242, in accordance with some embodiments.

As shown in FIG. 1M, a mask layer 270 is formed over the semiconductor substrate 110 in the logic region 114 to cover the mask layer 250 and the gates 244 in the logic region 114, in accordance with some embodiments. Thereafter, the mask layer 250 exposed by the mask layer 270 is removed, in accordance with some embodiments. The removal process includes a dry etching process and a wet etching process, in accordance with some embodiments.

As shown in FIG. 1N, an anisotropic etching back process is performed to remove a portion of the conductive layer 240 over the gate stacks G1 and G2 and the semiconductor substrate 110, in accordance with some embodiments. The anisotropic etching back process further removes a portion of the gate dielectric material layer 130 in the logic region 114, in accordance with some embodiments. The etched conductive layer 240 includes an erase gate 246, word lines 247 and 248, and gates 244 separated from each other, in accordance with some embodiments.

The erase gate 246 is in the gap P, in accordance with some embodiments. The erase gate 246 is also referred to as a common erase gate, in accordance with some embodiments. The erase gate 246 has a recess 246a recessed toward the semiconductor substrate 110, in accordance with some embodiments. The recess 246a is a curved recess, in accordance with some embodiments. The recess 246a has a depth D ranging from about 100 Å to about 300 Å, in accordance with some embodiments. A ratio of the depth D to a thickness T of the erase gate 246 ranges from about 0.1 to about 0.6, in accordance with some embodiments.

The erase gate 246 has a top surface 246b, in accordance with some embodiments. The top surface 246b is curved toward or recessed toward the semiconductor substrate 110, in accordance with some embodiments. The top surface 246b serves as an inner wall and a bottom surface of the recess 246a, in accordance with some embodiments.

The word line 247 is adjacent to the gate stack G1, in accordance with some embodiments. The word line 247 is over the sidewall S1, in accordance with some embodiments. The spacer 212 is located between the gate stack G1 and the word line 247, in accordance with some embodiments. The spacer 212 is configured to electrically insulate the gate stack G1 from the word line 247, in accordance with some embodiments.

The word line 248 is adjacent to the gate stack G2, in accordance with some embodiments. The word line 248 is over the sidewall S3, in accordance with some embodiments. The spacer 216 is located between the word line 248 and the gate stack G2, in accordance with some embodiments. The spacer 216 is configured to electrically insulate the gate stack G2 from the word line 248, in accordance with some embodiments. The gate stacks G1 and G2 and the erase gate 246 are located between the word lines 247 and 248, in accordance with some embodiments.

As shown in FIG. 1O, the mask layers 250 and 270 are removed, in accordance with some embodiments. As shown in FIG. 1P, spacers 281, 282, 283, 284, and 285 are formed, in accordance with some embodiments. The spacer 281 is formed over a sidewall 247a of the word line 247, in accordance with some embodiments.

The spacer 282 is formed over the top surface 246b of the erase gate 246 and the sidewall S2 of the gate stack G1, in accordance with some embodiments. The spacer 283 is formed over the top surface 246b of the erase gate 246 and the sidewall S4 of the gate stack G2, in accordance with some embodiments.

Portions of the spacers 282 and 283 are in the recess 246a, in accordance with some embodiments. The spacer 284 is formed over a sidewall 248a of the word line 248, in accordance with some embodiments. The spacers 285 are formed over sidewalls 244a of the gates 244, in accordance with some embodiments.

The spacers 281, 282, 283, 284, and 285 include an insulating material, such as silicon oxide or silicon nitride. The spacers 281, 282, 283, 284, and 285 are formed using a deposition process (e.g., a chemical vapor deposition process) and an etching process (e.g., a dry etching process).

As shown in FIG. 1P, doped regions 117, 118, and 119 are formed in the semiconductor substrate 110, in accordance with some embodiments. The doped region 117 is adjacent to the spacer 281, in accordance with some embodiments. The doped region 118 is adjacent to the spacer 284, in accordance with some embodiments.

The doped regions 119 are adjacent to or between the spacers 285 (or the gates 244), in accordance with some embodiments. The doped regions 117 and 118 are also referred to as drain regions, in accordance with some embodiments. The doped regions 119 are source regions and drain regions according to requirements.

The doped regions 117, 118, and 119 are doped with n-type impurities (e.g., phosphorus) or p-type impurities (e.g., boron), in accordance with some embodiments. The doped regions 116, 117, 118, and 119 are doped with the same type impurities, in accordance with some embodiments. The doped regions 117, 118, and 119 are formed using an ion implantation process, in accordance with some embodiments.

As shown in FIG. 1P, metal silicide layers 291, 292, 293, 294, 295, and 296 are formed over the doped region 117, the word line 247, the erase gate 246, the word line 248, the doped region 118, and the doped regions 119, respectively, in accordance with some embodiments. The metal silicide layer 293 is located over the erase gate 246 and between the spacers 282 and 283, in accordance with some embodiments. The metal silicide layer 293 is in direct contact with the spacers 282 and 283, in accordance with some embodiments.

In this step, memory cells F1 and F2 and transistors T are substantially formed, in accordance with some embodiments. The memory cells F1 and F2 are also referred to as flash memory cells, in accordance with some embodiments. The memory cell F1 includes the gate stack G1, the erase gate 246, the word line 247, the doped regions 116 and 117, in accordance with some embodiments.

The memory cell F2 includes the gate stack G2, the erase gate 246, the word line 248, the doped regions 116 and 118, in accordance with some embodiments. Each of the transistors T includes one of the gates 244 and two doped regions 119 adjacent to the one of the gates 244, in accordance with some embodiments.

As shown in FIG. 1Q, a contact etching stop layer 310 is formed over the semiconductor substrate 110 to cover the metal silicide layers 291, 292, 293, 294, 295, and 296, in accordance with some embodiments. The contact etching stop layer 310 includes a dielectric material, in accordance with some embodiments. The contact etching stop layer 310 includes silicon nitride, in accordance with some embodiments.

The contact etching stop layer 310 is formed over the metal silicide layers 291, 292, 293, 294, 295, and 296, the spacers 212, 216, 281, 282, 283, 284, and 285, the gate stacks G1 and G2, the transistors T, and the semiconductor substrate 110, in accordance with some embodiments. In some other embodiments, the contact etching stop layer 310 is not formed.

As shown in FIG. 1Q, an insulating layer 320 is deposited over the contact etching stop layer 310, in accordance with some embodiments. The insulating layer 320 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments.

The insulating layer 320 is deposited using a CVD process, a HDPCVD process, a spin-on process, a sputtering process, or a combination thereof, in accordance with some embodiments. Thereafter, openings 322, 324, and 326 are formed in the insulating layer 320 and the contact etching stop layer 310 to expose the metal silicide layers 291, 293, and 295, respectively, in accordance with some embodiments. The openings 322, 324, and 326 are formed using a photolithography process and an etching process, in accordance with some embodiments.

As shown in FIG. 1Q, a conductive layer 330 is deposited over the insulating layer 320 and is filled into the openings 322, 324, and 326 to electrically contact the metal silicide layers 291, 293, and 295, in accordance with some embodiments. The conductive layer 330 is formed by, for example, a PVD process or other suitable processes. The conductive layer 330 is made of, for example, tungsten or other suitable conductive materials.

As shown in FIG. 1R, the conductive layer 330 outside of the openings 322, 324, and 326 are removed, in accordance with some embodiments. The removal process includes a chemical mechanical polishing (CMP) process, in accordance with some embodiments. After the removal process, the conductive layer 330 remaining in the opening 322 forms a contact structure 332, in accordance with some embodiments. The contact structure 332 is electrically connected to the metal silicide layer 291, in accordance with some embodiments.

The conductive layer 330 remaining in the opening 324 forms a contact structure 334, in accordance with some embodiments. The contact structure 334 is located over the erase gate 246 and between the spacers 282 and 283, in accordance with some embodiments. The contact structure 334 is electrically connected to the metal silicide layer 293 and the erase gate 246, in accordance with some embodiments. The conductive layer 330 remaining in the opening 326 forms a contact structure 336, in accordance with some embodiments. The contact structure 336 is electrically connected to the metal silicide layer 295, in accordance with some embodiments.

As shown in FIG. 1R, a wiring layer 340 is formed over the insulating layer 320 and the contact structures 332, 334, and 336 to be electrically connected to the contact structures 332, 334, and 336, in accordance with some embodiments. The wiring layer 340 is formed using a deposition process, a photolithography process, and an etching process, in accordance with some embodiments.

Since the word lines 247 and 248 are formed using a deposition process and an anisotropic etching back process, the difference between the widths W2 and W3 of the word lines 247 and 248 depends on the uniformity of the thickness of the conductive layer 240 (as shown in FIG. 1M), in accordance with some embodiments.

The conductive layer 240 formed by the deposition process (e.g., a CVD process) has a good uniformity of thickness. Therefore, the difference between the widths W2 and W3 of the word lines 247 and 248 is small. In some embodiments, the difference between the widths W2 and W3 is less than that of word lines formed using a photolithography process. Therefore, the electrical property of the memory cells F1 and F2 is improved. Furthermore, since the word lines 247 and 248 are formed without using a photolithography process, the manufacturing cost is reduced, and the process for forming the memory cells F1 and F2 is simplified.

The difference between the widths W2 and W3 of the word lines 247 and 248 ranges from about 1 Å to about 10 Å, in accordance with some embodiments. A ratio of the difference between the widths W2 and W3 to the width W2 (or W3) ranges from about 0.001 to about 0.05, in accordance with some embodiments. The width W2 or W3 ranges from about 100 Å to about 800 Å, in accordance with some embodiments. Since the ratio of the difference between the widths W2 and W3 to the width W2 (or W3) is small enough (i.e., about 0.001-0.05), the electrical property of the memory cells F1 and F2 is good.

The spacers 282 and 283 are formed over the sidewall S2 of the gate stack G1 and the sidewall S4 of the gate stack G2 respectively. Therefore, the spacers 282 and 283 may help the opening 324 to be self-aligned with the metal silicide layer 293 (or the erase gate 246). Therefore, the misalignment between the contact structure 334 and the metal silicide layer 293 (or the erase gate 246) is prevented, in accordance with some embodiments.

Since the erase gate 246 has the recess 246a, the metal silicide layer 293 has a recess 293a as well, which enlarges the contact surface between the metal silicide layer 293 and the contact structure 334, in accordance with some embodiments. Therefore, the contact resistance between the contact structure 334 and the erase gate 246 is reduced, in accordance with some embodiments.

In accordance with some embodiments, semiconductor device structures and methods for forming the same are provided. The methods (for forming the semiconductor device structure) form word lines using a deposition process and an anisotropic etching back process (without using a photolithography process). Therefore, the difference between the widths of the word lines is less than that of word lines formed using a photolithography process. As a result, the electrical property of the semiconductor device structure with the word lines is improved. Since the word lines are formed without using a photolithography process, the manufacturing cost is reduced, and the process is simplified.

In accordance with some embodiments, a semiconductor device structure is provided. The semiconductor device structure includes a semiconductor substrate. The semiconductor device structure includes a first gate stack over the semiconductor substrate. The semiconductor device structure includes a second gate stack over the semiconductor substrate. The semiconductor device structure includes an erase gate between the first gate stack and the second gate stack. The erase gate has a recess recessed toward the semiconductor substrate. The semiconductor device structure includes a first word line adjacent to the first gate stack. The semiconductor device structure includes a second word line adjacent to the second gate stack.

In accordance with some embodiments, a semiconductor device structure is provided. The semiconductor device structure includes a semiconductor substrate. The semiconductor device structure includes a first gate stack over the semiconductor substrate. The semiconductor device structure includes a second gate stack over the semiconductor substrate. The semiconductor device structure includes an erase gate between the first gate stack and the second gate stack. The semiconductor device structure includes a first word line adjacent to the first gate stack. The first word line has a first width. The semiconductor device structure includes a second word line adjacent to the second gate stack. The second word line has a second width. A ratio of a difference between the first width and the second width to the first width ranges from about 0.001 to about 0.05.

In accordance with some embodiments, a method for forming a semiconductor device structure is provided. The method includes forming a first gate stack and a second gate stack over a semiconductor substrate. The first gate stack and the second gate stack are separated from each other by a gap. The first gate stack has a first sidewall facing away from the gap. The second gate stack has a second sidewall facing away from the gap. The method includes forming a conductive layer over the semiconductor substrate to fill the gap and cover the first gate stack and the second gate stack. The conductive layer conformally covers the first sidewall, the second sidewall, and the semiconductor substrate. The method includes performing an anisotropic etching back process to remove a portion of the conductive layer. The etched conductive layer includes an erase gate, a first word line, and a second word line separated from each other. The erase gate is in the gap. The first word line is over the first sidewall. The second word line is over the second sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a first gate stack over the semiconductor substrate;
   a second gate stack over the semiconductor substrate;
   an erase gate between the first gate stack and the second gate stack, wherein the erase gate has a recess recessed toward the semiconductor substrate;
   a first word line adjacent to the first gate stack;
   a second word line adjacent to the second gate stack;
   a first spacer over a top surface of the erase gate; and
   a second spacer over the top surface of the erase gate, wherein the first spacer and the second spacer are separated from each other.

2. The semiconductor device structure as claimed in claim 1, wherein the first gate stack comprises a first floating gate and a first control gate over the first floating gate, and the second gate stack comprises a second floating gate and a second control gate over the second floating gate.

3. The semiconductor device structure as claimed in claim 1, wherein the first spacer is over a first sidewall of the first gate stack, and the second spacer is over a second sidewall of the second gate stack.

4. The semiconductor device structure as claimed in claim 1, further comprising:
   a metal silicide layer over the erase gate and between the first spacer and the second spacer, wherein the metal silicide layer is in direct contact with the first spacer and the second spacer.

5. The semiconductor device structure as claimed in claim 1, further comprising:
   a contact structure over the erase gate and between the first spacer and the second spacer, wherein the contact structure is electrically connected to the erase gate.

6. The semiconductor device structure as claimed in claim 1, further comprising:
   a third spacer between the first word line and the first gate stack; and
   a fourth spacer between the second word line and the second gate stack.

7. The semiconductor device structure as claimed in claim 1, wherein the recess is a curved recess.

8. The semiconductor device structure as claimed in claim 1, wherein the semiconductor substrate has a first doped region, a second doped region, and a third doped region, the erase gate is over the first doped region, the first word line is between the second doped region and the first gate stack, and the second word line is between the third doped region and the second gate stack.

9. The semiconductor device structure as claimed in claim 1, wherein the first word line has a first width and the second word line has a second width, and a difference between the first width and the second width ranges from 1 to 10 Å.

10. The semiconductor device structure as claimed in claim 1, wherein the erase gate, the first word line, and the second word line comprise a same material.

11. The semiconductor device structure as claimed in claim 1, further comprising:
    a third spacer over a first sidewall of the first word line; and
    a fourth spacer over a second sidewall of the second word line, wherein the first spacer, the second spacer, the third spacer, and the fourth spacer comprise a same material.

12. The semiconductor device structure as claimed in claim 6, wherein the first spacer is an ONO (oxide/nitride/oxide) layer, and the second spacer is an ONO layer.

13. The semiconductor device structure as claimed in claim 9, wherein a ratio of the difference between the first width and the second width to the first width ranges from 0.001 to 0.05.

14. A semiconductor device structure, comprising:
    a semiconductor substrate;
    a first gate stack over the semiconductor substrate;
    a second gate stack over the semiconductor substrate;
    an erase gate between the first gate stack and the second gate stack, wherein the erase gate has a recess recessed toward the semiconductor substrate;
    a first spacer over the erase gate and adjacent to the first gate stack;
    a second spacer over the erase gate and adjacent to the second gate stack, wherein a first portion of the first spacer and a second portion of the second spacer are in the recess;
    a first word line adjacent to the first gate stack; and
    a second word line adjacent to the second gate stack.

15. The semiconductor device structure as claimed in claim 14, wherein the first gate stack comprises a first floating gate and a first control gate over the first floating gate, and the second gate stack comprises a second floating gate and a second control gate over the second floating gate.

16. The semiconductor device structure as claimed in claim 14, further comprising:
    a third spacer between the first word line and the first gate stack; and
    a fourth spacer between the second word line and the second gate stack.

17. The semiconductor device structure as claimed in claim 14, wherein the first gate stack, the erase gate, and the second gate stack are between the first word line and the second word line.

18. The semiconductor device structure as claimed in claim 14, further comprising:
    a contact structure over the erase gate and between the first spacer and the second spacer, wherein the contact structure is electrically connected to the erase gate.

19. The semiconductor device structure as claimed in claim 14, wherein the erase gate, the first word line, and the second word line comprise a same material.

20. The semiconductor device structure as claimed in claim 14, further comprising:
    a third spacer over a first sidewall of the first word line; and
    a fourth spacer over a second sidewall of the second word line, wherein the first spacer, the second spacer, the third spacer, and the fourth spacer comprise a same material.

* * * * *